(12) United States Patent
Doll et al.

(10) Patent No.: US 11,442,544 B2
(45) Date of Patent: Sep. 13, 2022

(54) FORCE TRANSDUCER FOR ELECTRONIC DEVICES

(71) Applicant: Apple Inc., Cupertino, CA (US)

(72) Inventors: Joseph C. Doll, Mountainview, CA (US); Pavan O. Gupta, Belmont, CA (US); Teera Songatikamas, San Jose, CA (US); Adam J. Monkowski, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 684 days.

(21) Appl. No.: 15/949,968

(22) Filed: Apr. 10, 2018

(65) Prior Publication Data

US 2018/0314331 A1 Nov. 1, 2018

Related U.S. Application Data

(60) Provisional application No. 62/492,742, filed on May 1, 2017.

(51) Int. Cl.
*G06F 3/01* (2006.01)
*H01L 27/20* (2006.01)
(Continued)

(52) U.S. Cl.
CPC ............ *G06F 3/016* (2013.01); *G06F 1/1626* (2013.01); *G06F 1/1637* (2013.01); *G06F 1/1643* (2013.01); *G06F 3/041* (2013.01); *G06F 3/044* (2013.01); *G06F 3/0412* (2013.01); *G06F 3/0416* (2013.01); *H01L 27/20* (2013.01); *H01L 41/042* (2013.01); *H01L 41/047* (2013.01); *H01L 41/0825* (2013.01); *H01L 41/1871* (2013.01); *H01L 41/1873* (2013.01)

(58) Field of Classification Search
CPC ...... G06F 3/016; G06F 1/1626; G06F 1/1637; G06F 1/1643; G06F 3/041; G06F 3/0412; G06F 3/0414; G06F 3/0416; G06F 3/044; H01L 27/20; H01L 41/042; H01L 41/047; H01L 41/0825; H01L 41/1871; H01L 41/1873
USPC .......................................................... 345/173
See application file for complete search history.

(56) References Cited

U.S. PATENT DOCUMENTS

2004/0169438 A1* 9/2004 Cramer .................. H01L 41/083 310/328
2008/0100568 A1* 5/2008 Koch ...................... G06F 3/016 345/156

(Continued)

*Primary Examiner* — Amare Mengistu
*Assistant Examiner* — Gloryvid Figueroa-Gibson
(74) *Attorney, Agent, or Firm* — Brownstein Hyatt Farber Schreck, LLP

(57) ABSTRACT

A force transducer for an electronic device can be operated in a drive mode and a sense mode simultaneously. In particular, the force transducer can provide haptic output while simultaneously receiving force input from a user. The force transducer is primarily defined by a monolithic piezoelectric body, a ground electrode, a drive electrode, and a sense electrode. The ground electrode and the drive electrode each include multiple electrically-electrically conductive sheets that extend into the monolithic body; the electrically conductive sheets of the ground electrode and the drive electrode are interdigitally engaged. The sense electrode of the force transducer is typically disposed on an exterior surface of the monolithic body.

20 Claims, 13 Drawing Sheets

(51) Int. Cl.
*H01L 41/04* (2006.01)
*H01L 41/08* (2006.01)
*H01L 41/187* (2006.01)
*G06F 3/041* (2006.01)
*H01L 41/047* (2006.01)
*G06F 3/044* (2006.01)
*G06F 1/16* (2006.01)

(56) References Cited

U.S. PATENT DOCUMENTS

| | | | | | |
|---|---|---|---|---|---|
| 2011/0310055 | A1* | 12/2011 | An | .......................... | G06F 3/016 |
| | | | | | 345/174 |
| 2012/0291550 | A1* | 11/2012 | Kato | .................. | G01C 19/5776 |
| | | | | | 73/504.12 |
| 2015/0370328 | A1* | 12/2015 | Backman | ................ | G06F 3/038 |
| | | | | | 345/156 |
| 2016/0176187 | A1* | 6/2016 | Guidotti | ............... | B41J 2/04581 |
| | | | | | 347/10 |
| 2017/0199624 | A1* | 7/2017 | Nathan | ................. | G06F 3/0414 |

* cited by examiner

FORCE TRANSDUCER FOR ELECTRONIC DEVICES

CROSS-REFERENCE TO RELATED APPLICATIONS

This application claims the benefit under 35 U.S.C. § 119(e) of U.S. Provisional Patent Application No. 62/492,742, filed on May 1, 2017, and entitled "Force Transducer For Electronic Devices," the contents of which is incorporated by reference as if fully disclosed herein.

FIELD

Embodiments described herein relate to electronic devices, and in particular, to electronic devices that incorporate a force transducer to provide an interface to receive force input from a user and to provide haptic output to that user.

BACKGROUND

An electronic device can include an input sensor to detect when a user applies a purposeful force to an external surface of the electronic device, which may be a protective cover positioned over an active display region of an electronic display. Output from the sensor can be used to interact with content shown on the display, or for any other suitable purpose. Such sensors can be referred to as "force input sensors."

An electronic device can also include a mechanical actuator to generate tactile sensations for a user, generally referred to as "haptic output." Mechanical output from the actuator can inform the user of a specific mode, operation, or state of the electronic device, or for any other suitable purpose. Such actuators, together with associated electronic circuitry, can be referred to as "haptic output components."

In conventional configurations, force input sensors and haptic output components are separately controlled and operated and independently contribute to undesirable increases in thickness, weight, power consumption, and manufacturing complexity of an electronic device.

SUMMARY

Certain embodiments described herein relate to, include, or take the form of a force transducer including: a ground electrode with a first number of electrically conductive sheets and a drive electrode with a second number of electrically conductive sheets. In these examples, the electrically conductive sheets of the drive electrode and the electrically conductive sheets of the ground electrode are interdigitally engaged and separated by a monolithic body of piezoelectric material. One or more sense electrodes are disposed onto an upper surface of the monolithic body, directly above one of the electrically conductive sheets of the ground electrode. As a result of this construction, the force transducer can be operated in a drive mode and a sense mode simultaneously or independently.

In many embodiments, a force transducer can be coupled to a stiffener. The stiffener can concentrate and/or redirect compression or expansion of the monolithic body of the force transducer. In some embodiments, the stiffener is formed from metal, but this may not be required; suitable materials for the stiffener include, but may not be limited to: organic materials, synthetic materials, metal, plastic, glass, carbon fiber reinforced plastics, and so on, or combinations or multi-layer configurations thereof.

The stiffener can be coupled to a ground electrode, a drive electrode, a sense electrode or any combination thereof. The stiffener can be coupled to any suitable surface of the force transducer. In some embodiments, the force transducer may be sealed against the stiffener (e.g., encapsulated), but this may not be required.

Other embodiments described generally reference electronic device including a display within a housing. A multimode force interface can be positioned below the display. The multimode force interface typically includes at least one interdigitated multimode force transducer and a controller. The controller is electrically coupled to the interdigitated multimode force transducer and configured to operate the interdigitated multimode force transducer in a drive mode and a sense mode.

Still further embodiments described herein generally reference method of operating a multimode force interface including the operations of: providing a drive signal to a drive electrode of an interdigitated multimode force transducer, obtaining a sense signal from a sense electrode of the interdigitated multimode force transducer, and filtering the sense signal based on the drive signal.

BRIEF DESCRIPTION OF THE DRAWINGS

Reference will now be made to representative embodiments illustrated in the accompanying figures. It should be understood that the following descriptions are not intended to limit this disclosure to one preferred embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
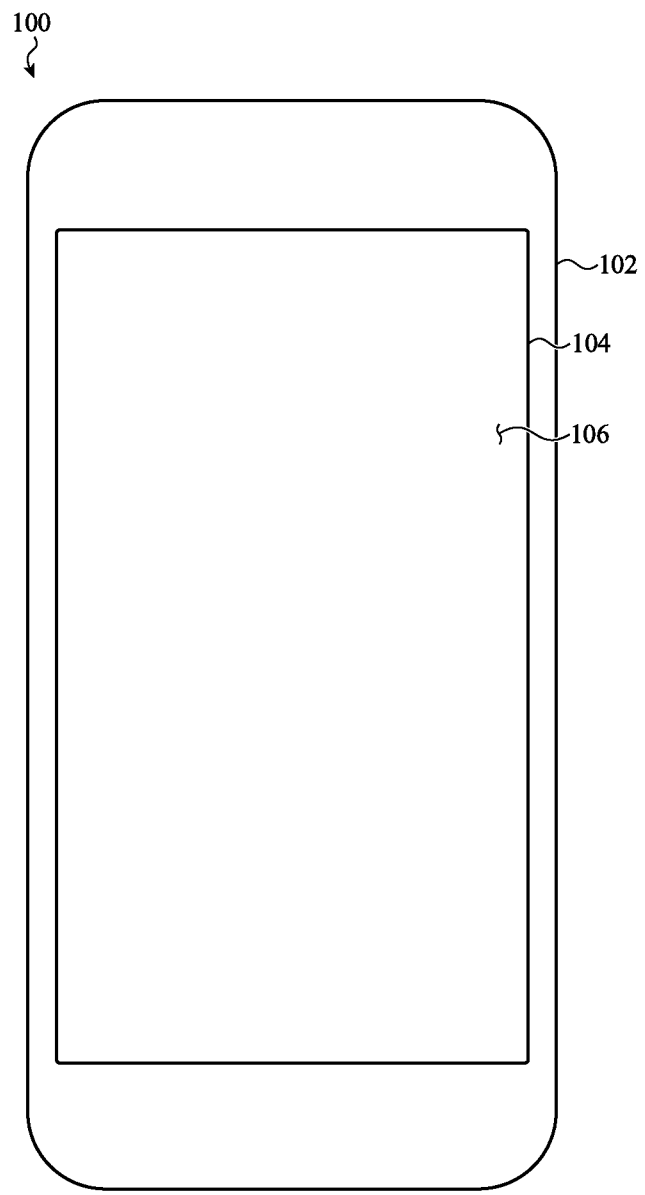
FIG. 1A depicts an electronic device that can incorporate a multimode force interface, such as described herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein reference an electronic device that includes a multimode force interface. The phrase "multimode force interface," as used herein, generally references a system or cooperation of components configured to receive force input at a surface from a user and, additionally, to provide haptic output to that same user through the same surface. The surface associated with a multimode force interface, such as described herein, can be referred to as an "interface surface."

In one example, a multimode force interface is operated in conjunction with a display of an electronic device. In this example, the interface surface can be a protective outer cover (e.g., transparent glass, sapphire, plastic) positioned over an active display area of the display. A user that exerts a force onto the protective outer cover signals an intent to interact with content shown on the display at that location. In response, the multimode force interface can generate a haptic output (e.g., click, vibration, shift, pop, and so on) through the display at, or near, that location to inform the user that the force input was received. In other examples, one or more haptic outputs can be provided through the protective outer cover in response to—or independent of—one or more force inputs in a different or implementation-specific or configuration-specific manner.

In another example, a multimode force interface is operated in conjunction with an input surface of an electronic device, such as a trackpad. In this example, the interface surface is the external surface of the trackpad, which can be formed from an opaque or transparent material such as metal, glass, organic materials, synthetic materials, woven materials, and so on. A user can exert a force onto a portion of the input surface to instruct the electronic device to perform an action. In response, the multimode force interface can generate a haptic output at, or near, that location to inform the user that the force input was received. As with other example configurations, one or more haptic outputs can be provided through the input surface in response to—or independent of—one or more force inputs in a different or implementation-specific or configuration-specific manner.

In yet another example, a multimode force interface is operated in conjunction with a touch input device, such as a touch screen. A user can touch the touch input device—without purposeful force—to examine its surface. In response to the user touching a particular location, the multimode force interface can generate a haptic output (e.g., click, vibration, and so on) at or near that location to inform the user of an operation, feature, or action associated with applying a purposeful force to that location.

For simplicity of description, many embodiments that follow reference a multimode force interface operated in conjunction with a display of a portable electronic device. In particular, the multimode force interface is positioned behind a display (or within or above a display stack), enclosed within a housing of the portable electronic device that incorporates the display. In these examples, the interface surface is an external surface of the portable electronic device, although this may not be required. It may be appreciated, however, that this is merely one example; other configurations, implementations, and constructions are contemplated in view of the various principles and methods of operation—and reasonable alternatives thereto described in reference to the embodiments that follow.

In one embodiment, a multimode force interface includes a controller electrically coupled to an array of force transducers arranged in a pattern and positioned relative to an active display region of a display of a portable electronic device.

The controller can include, or can be communicably coupled to, circuitry and/or logic components, such as a processor. The circuitry can perform or coordinate some or all of the operations of the controller including, but not limited to: providing a signal to a force transducer to generate a haptic output (herein, "drive signals"); receiving a signal from a force transducer associated with a force input received from a user (herein, "sense signals"); filtering sense signals based on one or more drive signals; characterizing a haptic output—generated in response to an drive signal—based on an sense signal; and so on.

The processor of the controller can be implemented as any electronic device or component capable of processing, receiving, or transmitting data or instructions in an analog and/or digital domain. For example, the processor can be a microprocessor, a central processing unit, an application-specific integrated circuit, a field-programmable gate array, a digital signal processor, an analog circuit, a digital circuit, or combination of such devices. The processor may be a single-thread or multi-thread processor. The processor may be a single-core or multi-core processor.

Accordingly, as described herein, the phrase "processing unit" or, more generally, "processor" refers to a hardware-implemented data processing device or circuit physically structured to execute specific transformations of data including data operations represented as code and/or instructions included in a program that can be stored within and accessed from an integrated or separate memory. The term or phrase is meant to encompass a single processor or processing unit, multiple processors, multiple processing units, analog or digital circuits, or other suitably configured computing element or combination of elements.

In many cases, each force transducer of the array of force transducers is constructed in the same manner, although this may not be required and certain force transducers of the array can be constructed differently from other force transducers of the same array.

A force transducer, such as described herein, can be configured to receive force input and to provide haptic output, either independently or simultaneously. More specifically, the force transducer can be operated in a "sense mode" (in which one or more force inputs can be received and measured) and/or a "drive mode" (in which one or more haptic outputs can be generated). In certain embodiments, the force transducer can be operated in the drive mode and the sense mode simultaneously; this operational configuration can be referred to as a "hybrid mode" of the force transducer.

Typically, a force transducer, such as described herein, includes a monolithic body (formed from a piezoelectric material), a ground electrode, a sense electrode, and a drive electrode. In typical embodiments, the ground electrode is accommodated within the monolithic body. In this example, the sense electrode can be accommodated on an upper surface of the monolithic body, substantially coplanar to the ground electrode. The drive electrode can be accommodated on a lower surface of the monolithic body, coplanar to the ground electrode. In this configuration, the monolithic body can be functionally divided into two regions—a "sense region" generally between the sense electrode and the ground electrode and a "drive region" generally between the drive electrode and the ground electrode. In some examples, the sense region is thinner than the drive region (e.g., sense electrodes and the ground electrode are separated by a smaller distance than the drive electrode and the ground electrode), but this may not be required of all embodiments. As noted with respect to other embodiments, described herein, the force transducer may be coupled to a stiffener. In some cases, the stiffener can be rigidly coupled to a top surface of the force transducer, whereas in other cases, the stiffener is coupled to a bottom surface of the force transducer.

In further embodiments, the ground electrode and the drive electrode of a force transducer cooperate to form an interdigitated structure of parallel sheets within the monolithic body. For example, the drive electrode can be constructed with two or more (e.g., a plurality of) substantially parallel sheets interdigitally positioned relative to two or more substantially parallel sheets of the ground electrode.

As a result of this construction, the ground electrode and the drive electrode can be positioned physically closer to one another without decreasing the volume of piezoelectric material defining the monolithic body. More specifically, this construction increases the magnitude of an electric field that can be generated between the drive and ground electrodes (e.g., by developing a voltage across the electrodes) that, in turn, can induce a mechanical deformation of the monolithic body via the piezoelectric effect. In this example construction, the drive region of the monolithic body is defined between the interdigitated parallel sheets of the drive electrode and ground electrode, and has a generally serpentine cross-section.

A force transducer constructed with interdigitated drive and ground electrodes (herein, an "interdigitated multimode force transducer") can generate a mechanical output of greater magnitude—when in a drive mode or hybrid mode—than a force transducer of the same volume that is constructed without interdigitated drive and ground electrodes. As such, an interdigitated multimode force transducer can be driven with a lower voltage than a conventional piezoelectric actuator without sacrificing performance.

In further embodiments, an interdigitated multimode force transducer can also include a sense electrode. In typical examples, the sense electrode is an electrically conductive sheet disposed onto or formed onto an external surface of the monolithic body, generally parallel to a sheet of the ground electrode. The sense electrode can be disposed in any suitable manner, including vapor deposition processes, electroforming processes, a screening or printing process, or any other suitable process.

In this example construction, the sense region of the monolithic body is defined between the sense electrode and the ground electrode. As a result of this construction, the ground electrode and the sense electrode are physically closer to one another and have increased overlapping area (compared to a conventional piezoelectric sensor having the same volume), which, in turn, can improve the performance of the transducer when operating in the sense mode or the hybrid mode.

These and other embodiments are discussed below with reference to FIGS. 1A-6. However, those skilled in the art will readily appreciate that the detailed description given herein with respect to these figures is for explanation only and should not be construed as limiting.

FIG. 1A shows an electronic device 100 that can include a multimode force interface. As with other embodiments described herein, the multimode force interface can be configured to receive force input from a user and to provide haptic output to that same user.

The electronic device 100 includes a housing 102 to retain, support, and/or enclose various components of the electronic device 100, such as a display 104. The display 104 may include a stack of multiple layers (e.g., a display stack) including, for example, and in no particular order: an organic light emitting diode layer, a touch input layer, a force input layer, and so on. Other embodiments can implement the display 104 in a different manner, such as with liquid crystal display technology, electronic ink technology, quantum dot technology, and so on.

The display 104 can be a planar display, wrap-around display, a bezel-less display, a reduced bezel display, a curved display, a rectilinear display, or any other suitable display. In some cases, the display 104 is flexible.

In many embodiments, the display 104 is positioned behind a protective outer layer that defines an interface surface 106 above an active display area of the display 104. The active display area of the display 104 is typically characterized by a distribution of individually-controllable pixels or pixel elements. In the illustrated example, the active display are of the display 104 can be understood to be within the rectangular line boundary of the display 104.

The various layers of the display 104, regardless of the implementation-specific display technology selected for a particular embodiment, may be adhered together with an optically transparent adhesive and/or may be supported by a common frame such that the layers abut one another. A common frame may extend around a perimeter, or a portion of the perimeter, of the layers, may be segmented around the perimeter, a portion of the perimeter, or may be coupled to the various layers of the display 104 in another manner.

The common frame can be made from any suitable material such as, but not limited to: metal, plastic, ceramic, acrylic, and so on. The common frame may be a multipurpose component serving an additional function such as, but not limited to: providing an environmental and/or hermetic seal to one or more components of the display 104 or the electronic device 100; providing structural support to the housing 102; providing pressure relief to one or more components of the display 104 or the electronic device 100; providing and defining gaps between one or more layers of the display 104 for thermal venting and/or to permit flexing of the layers in response to a force applied to the interface surface 106; and so on.

In some embodiments, the layers of the display 104 may be attached or deposited onto separate substrates that may be laminated or bonded to each other or otherwise encapsulated into a single package. The display 104 may also include, or can be positioned adjacent to, other layers suitable for improving the structural or optical performance of active display area of the display 104. Additionally, the display 104 may include or integrate a touch sensor (not shown) for determining the location of one or more touches on the interface surface 106 of the electronic device 100. In many examples, the touch sensor is a capacitive touch sensor configured to detect the location and/or area of one or more touches of a user's finger and/or a passive or active stylus relative to the active display area of the display 104 on the interface surface 106.

The electronic device 100 can also include a processor, memory, power supply and/or battery, network connections, sensors, input/output ports, acoustic elements, haptic elements, digital and/or analog circuits for performing and/or coordinating tasks of the electronic device 100, and so on. For simplicity of illustration, the electronic device 100 is depicted in FIG. 1A without many of these elements, each of which may be included, partially and/or entirely, within the housing 102 and may be operationally or functionally associated with, or coupled to, the display 104.

Furthermore, although illustrated as a cellular phone, the electronic device 100 can be another electronic device that is either stationary or portable, taking a larger or smaller form factor than illustrated. For example, in certain embodiments (and as noted above), the electronic device 100 can be a laptop computer, a tablet computer, a wearable device, a health monitoring device, a home or building automation device, a home or building appliance, a craft or vehicle entertainment, control, and/or information system, a navigation device, and so on.

As noted above, the electronic device 100 also includes a multimode force interface. In some embodiments, the multimode force interface includes a grid of force transducers, each of which can be incorporated into—or otherwise positioned relative to—the active display area of the display 104. As a result of this construction, a user can exert a force onto the protective outer cover over the display 104 to interact with content shown on the display 104 at the touch location. In response to the force input, the multimode force interface can generate a haptic output (e.g., click, vibration, shift, pop, and so on) through the display 104 at, or near, that location to inform the user that the force input was received.

Figure 1B:
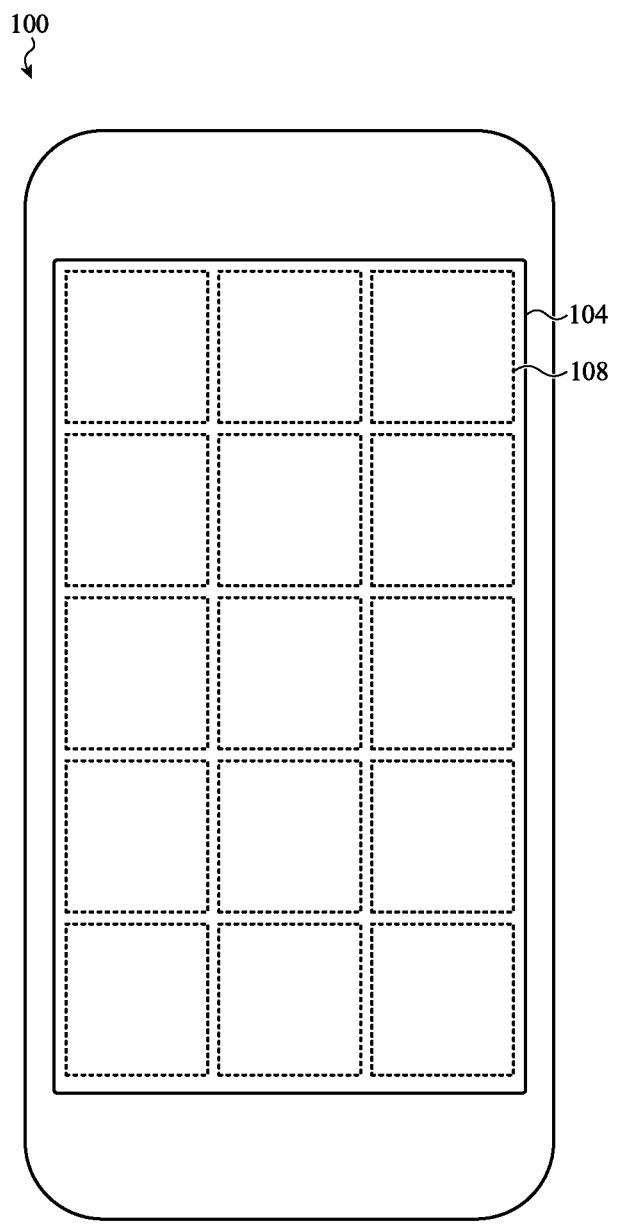
FIG. 1B depicts the electronic device of FIG. 1A, specifically depicting an array of force transducers associated with the multimode force interface.

FIG. 1B shows one example configuration of force transducers. The force transducer, one of which is identified as the force transducer 108, are distributed in a grid pattern below the interface surface 106. In one example, the grid of force transducers is accommodated on, or coupled to, a structural layer of the display stack of the display 104, but this may not be required.

Although illustrated as a grid, it may be appreciated that, force transducers can be distributed in any other suitable manner or pattern, across a portion of or the entirety of the active display area of the display 104. Furthermore, in certain embodiments, different force transducers of the grid of force transducers can have different size.

The multimode force interface of the electronic device 100 is typically associated with at least one electrical circuit (not shown), generally referred to as a controller. The controller can include both drive circuitry of the controller and sense circuitry of the controller. The drive circuity may be used to apply a drive signal (associated with a particular or selected haptic output) to a drive electrode the force transducer 108. Typically, the drive signal is a voltage signal that corresponds to a particular haptic output that can be generated by the force transducer 108, and/or any other force transducer of the grid. The sense circuitry of the controller may be used to receive a sense signal from a sense electrode of the force transducer 108. Typically, the sense signal is a voltage signal that changes in a manner that can be correlated to a compression or a strain experienced by the force transducer 108.

In many cases, both the drive circuitry of the controller and the sense circuitry of the controller can include one or more signal processing stages which can include, but may not be limited to, amplifying stages, filtering stages, multiplexing stages, digital-to-analog conversion stages, analog-to-digital conversion stages, comparison stages, feedback stages, charge amplification stages, and so on.

As noted with respect to other embodiments described herein, the force transducer 108 can be configured to operate in a drive mode, a sense mode, or a hybrid mode. For example, when in the drive mode, the force transducer 108 receives a drive signal from the drive circuitry of the controller and, in response, generates a haptic output through the interface surface 106. Similarly, when in the sense mode, the sense circuitry of the controller receives a sense signal from the force transducer 108 which, in turn, can be correlated by the controller (or another circuit or processor) to a magnitude of force input applied by a user to the interface surface 106.

In still further embodiments, the force transducer 108 can be operated in a hybrid mode. When in the force transducer 108 is operated in the hybrid mode, the controller receives a sense signal from a sense electrode of the force transducer 108 while the controller is simultaneously providing a drive signal to a drive electrode of the force transducer 108. In some configurations, the haptic output generated by the force transducer 108 in response to a drive signal can be detected by the sense circuitry of the controller. In these embodiments, the sense circuitry of the controller can be configured to cancel or otherwise filter portions of the haptic output from the sense signal to eliminate or mitigate effects of haptic output generated by the drive signal. Suitable filtering or cancelation operations can include, but may not be limited to: band-pass filtering, high-pass filtering, low-pass filtering, phase-shift cancellation, amplitude inversion cancelation, and so on.

In typical embodiments, each force transducer of the grid of force transducers, including the force transducer 108, are constructed and operated in the same manner, although this may not be required of all embodiments. More particularly, in many embodiments, the force transducer 108 is an interdigitated multimode force transducer having one or more sense electrodes. An example interdigitate force transducer is depicted in FIG. 2A.

Figure 2A:
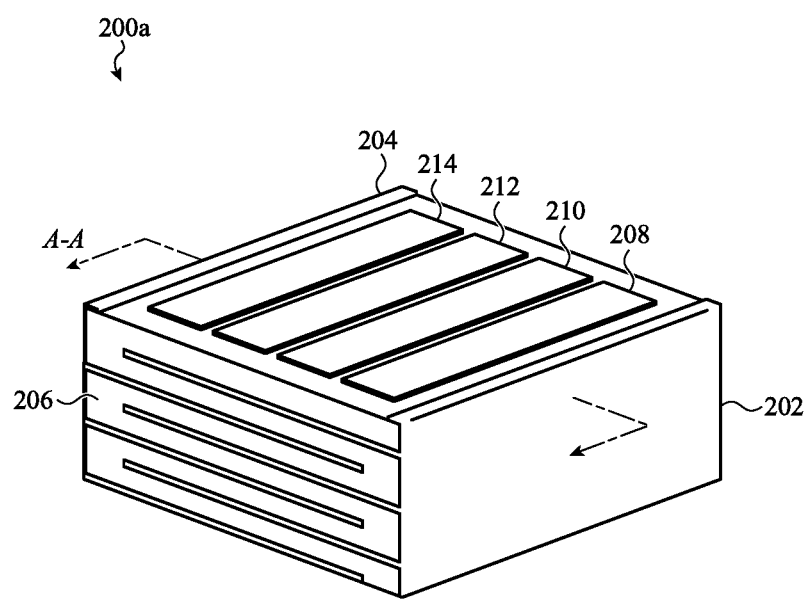
FIG. 2A depicts an example construction of an interdigitated multimode force transducer, such as described herein.

FIG. 2A depicts an example construction of an interdigitated multimode force transducer 200a. More specifically, the interdigitated multimode force transducer 200a includes a ground electrode 202 and a drive electrode 204 separated by a monolithic body 206. The interdigitated multimode force transducer 200a includes multiple sense electrodes. In the illustrated example, four sense electrodes are shown and identified as the sense electrode 208, the sense electrode 210, the sense electrode 212, and the sense electrode 214.

The ground electrode 202 and the drive electrode 204 and each of the sense electrodes are formed from electrically conductive materials. In many cases, the ground electrode 202 and the drive electrode 204 can be formed from the same material but this may not be required. Suitable materials for the electrodes include, but are not limited to: copper, gold, silver, titanium, and so on.

The monolithic body 206 is formed from a piezoelectric crystalline material that is configured to contract or expand in the presence of an electric field and, additionally, develop a measureable charge in response to compression or strain. Suitable piezoelectric materials include, but may not be limited to lead-based piezoelectric alloys (e.g., lead zirconate titante) or non-leaded materials such as metal niobates or barium titanate. In other examples, other piezoelectric compositions can be selected.

In the illustrated embodiment, the ground electrode 202 and the drive electrode 204 of the interdigitated multimode force transducer 200*a* cooperate to form an interdigitated structure of parallel sheets at least partially within the monolithic body 206. For example, as illustrated, the drive electrode 204 is constructed with three substantially parallel sheets interdigitally positioned relative to a corresponding three substantially parallel sheets of the ground electrode 202. In this example construction, a "drive region" of the monolithic body 206 is defined between the interdigitated parallel sheets of the drive electrode 204 and ground electrode 202, and has a generally serpentine cross-section (see, e.g., FIG. 2B).

In typical configurations, the sense electrodes 208, 210, 212, 214 are electrically isolated from one another and from the drive electrode 204 and the ground electrode 202. As a result of this construction, the sense electrodes can generate independent sense signals. A "sense region" of the monolithic body 206 is defined between the sense electrodes 208, 210, 212, 214 and an upper sheet of the ground electrode 202.

Figure 2B:
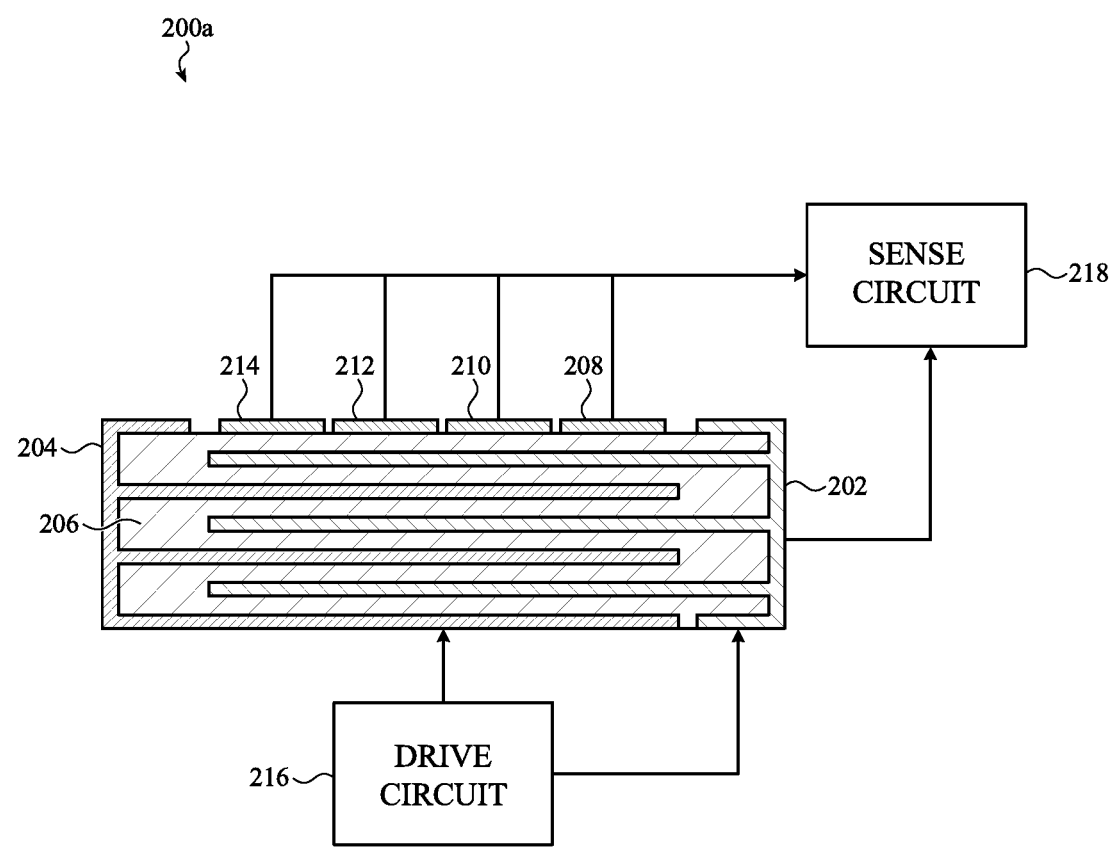
FIG. 2B is a cross-section of the interdigitated multimode force transducer of FIG. 2A, taken through section line A-A, particularly illustrating interdigitated drive electrode and ground electrode sheets, in addition to sense electrodes.

FIG. 2B is a cross-section of the interdigitated multimode force transducer 200*a*, taken through section line A-A. In this illustrated embodiment, a simplified representation of a drive circuit 216 is shown electrically coupled to the drive electrode 204 and the ground electrode 202. In addition, a simplified representation of a sense circuit 218 is shown electrically coupled to the sense electrodes 208, 210, 212, 214 and the ground electrode 202.

As with other embodiments described herein, the drive circuit 216 can be configured to apply any suitable drive signal to the drive electrode 204 to induce any mechanical output (e.g., haptic output). Similarly, the sense circuit 218 can be configured to obtain a sense signal from one or more of the sense electrodes 208, 210, 212, 214; characteristics of the sense signal(s) can be used to determine a magnitude of force applied to the interdigitated multimode force transducer 200*a*. Typically, the drive signal and sense signal occupy separable frequency bands. In one example, the drive signal is a higher frequency signal than the sense signal. In one specific example, the drive signal can have central frequency between 100 Hz and 250 Hz, and the sense signal can have a central frequency between 0 Hz and 20 Hz.

As noted above, the drive circuit 216 maybe configured to apply a drive signal to a drive electrode 204 of the interdigitated multimode force transducer 200*a*. The drive signal can be any suitable signal including, but not limited to, a voltage bias, a voltage signal, an alternating signal, and so on. In some cases, the drive signal has an arbitrary waveform.

The drive circuit 216 can be implemented in any number of suitable ways. In many examples, the drive circuit 216 includes one or more signal processing stages that may be used to generate, augment, or smooth the drive signal. For example, the drive circuit 216 can include one or more of, without limitation, amplifying stages, filtering stages, multiplexing stages, digital-to-analog conversion stages, analog-to-digital conversion stages, comparison stages, feedback stages, and so on. The drive circuit 216 can be implemented with analog circuit components, digital circuit components, passive circuit components, and/or active circuit components. In some examples, the drive circuit 216 is implemented as a single integrated circuit.

As with the drive circuit 216, the sense circuit 218 can be implemented in any number of suitable ways. In many examples, the sense circuit 218 includes one or more signal processing stages that may be used to receive, amplify, augment, or smooth a sense signal obtained from one or more of the sense electrodes 208, 210, 212, 214. For example, the sense circuit 218 can include one or more of, without limitation, amplifying stages, filtering stages, multiplexing stages, digital-to-analog conversion stages, analog-to-digital conversion stages, comparison stages, feedback stages, and so on. The sense circuit 218 can be implemented with analog circuit components, digital circuit components, passive circuit components, and/or active circuit components. In some examples, the sense circuit 218 is implemented as a single integrated circuit.

Once a sense signal (or more than one sense signal) is obtained, the sense circuit 218 can correlate the one or more properties of the sense signal(s) to an amount of compression or strain experienced by the interdigitated multimode force transducer 200*a*. In other cases, the sense circuit 218 can correlate the measurement directly to an amount of force applied to the interdigitated multimode force transducer 200*a*.

Figure 2C:
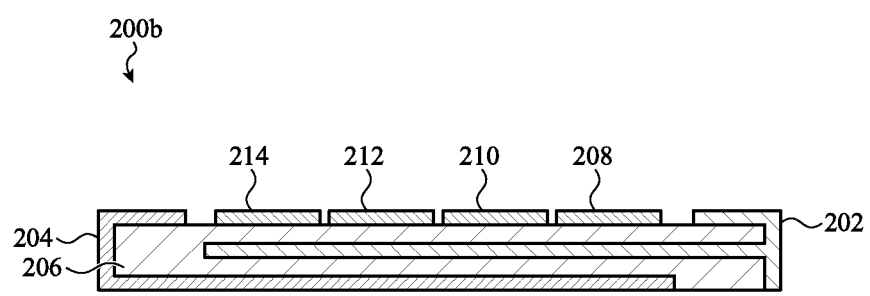
FIG. 2C depicts a cross-section of another interdigitated multimode force transducer, particularly illustrating interdigitated drive electrode and ground electrode sheets, in addition to sense electrodes.

In other cases, a different number of interdigitated sheets can be included. For example, similar to other embodiments described herein, FIG. 2C depicts a cross-section of an interdigitated multimode force transducer 200*b* showing a different number of interdigitated sheets than depicted in FIG. 2B. In other embodiments, still different configurations may be used; any number of sheets may be suitable. In some examples, the interdigitated sheets need not be planar; in some cases, a cross-section of one or more sheets may be formed in a pattern (e.g., serpentine, zig-zag, and so on).

It may be appreciated that for simplicity of illustration, the drive circuit and sense circuit (e.g., such as shown in FIG. 2B) are omitted from FIG. 2C. In particular, in the illustrated embodiment, a ground electrode 202 is defined within a monolithic body of the interdigitated multimode force transducer 200*b*.

As with other embodiments described herein, a drive circuit can be configured to apply any suitable drive signal to the drive electrode 204 to induce any mechanical output (e.g., haptic output). Similarly, the sense circuit can be configured to obtain a sense signal from one or more of the sense electrodes 208, 210, 212, 214; characteristics of the sense signal(s) can be used to determine a magnitude of force applied to the interdigitated multimode force transducer 200*b*.

Once a sense signal (or more than one sense signal) is obtained, the sense circuit can correlate the one or more properties of the sense signal(s) to an amount of compression or strain experienced by the interdigitated multimode force transducer 200*b*. In other cases, the sense circuit can correlate the measurement directly to an amount of force applied to the interdigitated multimode force transducer 200*b*.

Figure 2D:
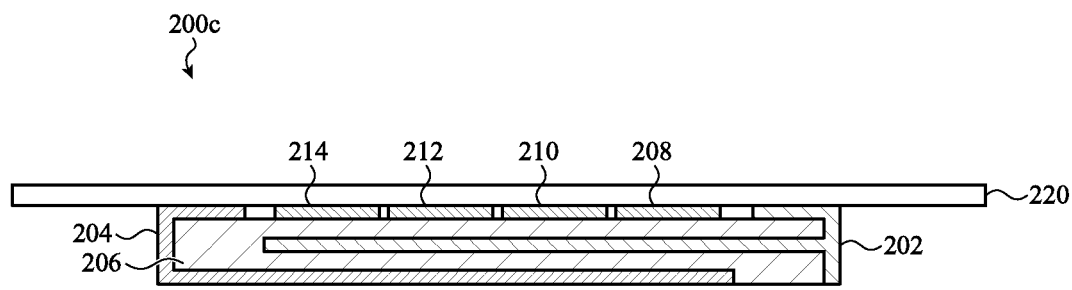
FIG. 2D depicts a cross-section of an interdigitated multimode force transducer coupled to a stiffener sheet.

In many embodiments, an interdigitated multimode force transducer is coupled to a stiffener. For example, as shown in FIG. 2D, an interdigitated multimode force transducer 200c is coupled to a stiffener 220. The stiffener 220, or stiffener sheet, can effect a concentration and/or redirection of compression or expansion within an interdigitated multimode force transducer. In particular, a stiffener sheet may translate a compression or expansion into a bending moment that results in an upward or downward deformation of the stiffener sheet.

The stiffener 220 can be made from any number of suitable materials including, but not limited to: metal, plastic, glass, carbon fiber reinforced plastic, ceramic, sapphire, and so on. In some cases, the stiffener 220 is a single layer of material, whereas in other cases, the stiffener 220 is formed from multiple laminated or adhered layers.

As with other embodiments described herein, it may be appreciated that for simplicity of illustration, the drive circuit and sense circuit (e.g., such as shown in FIG. 2B) are omitted. As with the embodiment depicted in FIG. 2C, a ground electrode 202 is defined within a monolithic body of the interdigitated multimode force transducer 200c.

As with other embodiments described herein, a drive circuit can be configured to apply any suitable drive signal to the drive electrode 204 to induce any suitable mechanical output (e.g., haptic output) via the stiffener 220. Similarly, the sense circuit can be configured to obtain a sense signal from one or more of the sense electrodes 208, 210, 212, 214.

Figure 2E:
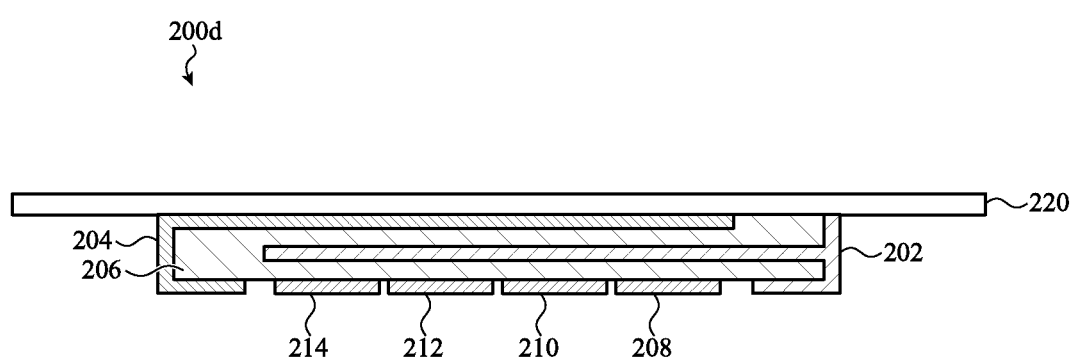
FIG. 2E depicts a cross-section of an interdigitated multimode force transducer coupled to a stiffener sheet.

As illustrated, the stiffener 220 is coupled the sense electrodes 208, 210, 212, 214 of the interdigitated multimode force transducer 200c, but this may not be required. For example, as shown in FIG. 2E—depicting the interdigitated multimode force transducer 200d—the stiffener 220 can be coupled opposite the sense electrodes 208, 210, 212, 214.

In many cases, the stiffener 220 is adhered to the interdigitated multimode force transducer 200c, 200d with pressure sensitive adhesive. In other cases, the stiffener 200 can be adhered in another manner including, but not limited to: with curable adhesive, mechanical lamination, co-forming or co-molding, abrasion and metallic micro-bonding, and so on.

Figure 2F:
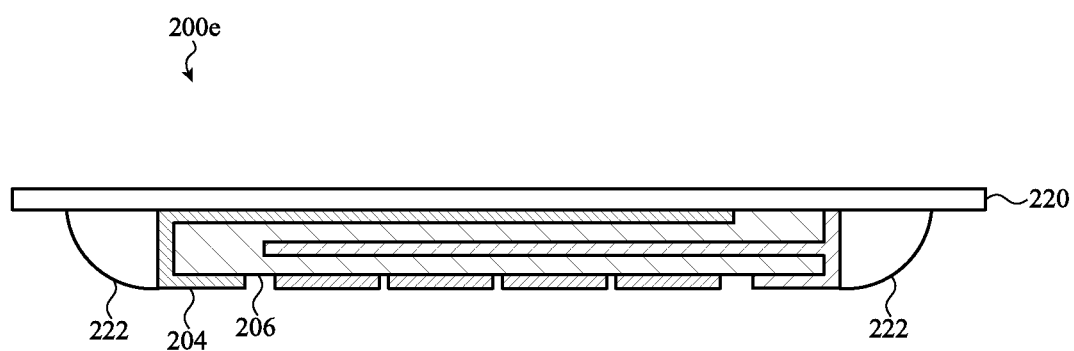
FIG. 2F depicts a cross-section of an interdigitated multimode force transducer encapsulated to a stiffener sheet.

In still other embodiments, such as shown in FIG. 2F, a interdigitated multimode force transducer 200e can be coupled to a stiffener 220 in a manner that seals the interdigitated multimode force transducer 200e to the stiffener 220. In particular, an encapsulation 222 can be applied around the perimeter of the interdigitated multimode force transducer 200e such that the stiffener and the interdigitated multimode force transducer 200e are bonded together. The encapsulation 222 can provide both mechanical bonding an environmental protection. In other case, the encapsulation 222 may additionally serve to isolate high voltage drive signals from adjacent circuit.

Figure 2G:
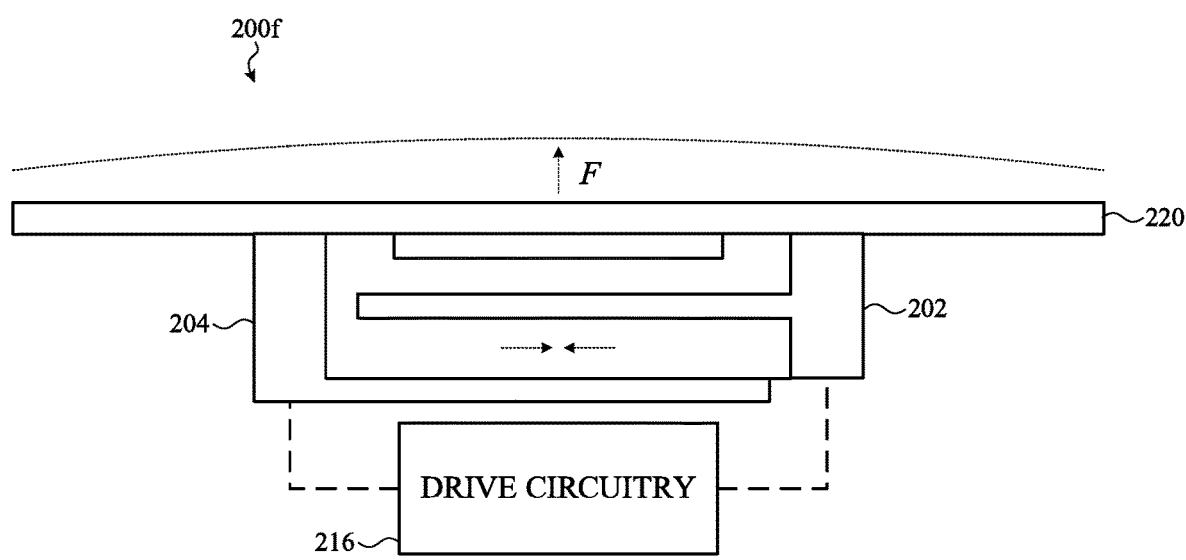
FIG. 2G depicts a cross-section of an interdigitated multimode force transducer coupled to a stiffener sheet and operating in a drive mode.

As noted above, the stiffener 220 can effect a concentration and/or redirection of compression or expansion within an interdigitated multimode force transducer. In particular, a stiffener sheet may translate a compression or expansion into a bending moment that results in an upward or downward deformation of the stiffener sheet. For example, as shown in FIG. 2G, a simplified interdigitated multimode force transducer 200f includes a ground electrode 202 and a drive electrode 204. A drive circuit 216 applies a drive signal across the ground electrode 202 and the drive electrode 204. The simplified interdigitated multimode force transducer 200e is coupled to a stiffener 220. In response to the drive signal applied to the ground electrode 202 and the drive electrode 204, the body of the simplified interdigitated multimode force transducer 200f may compress, causing the stiffener 220 to bend in an upward direction.

Figure 2H:
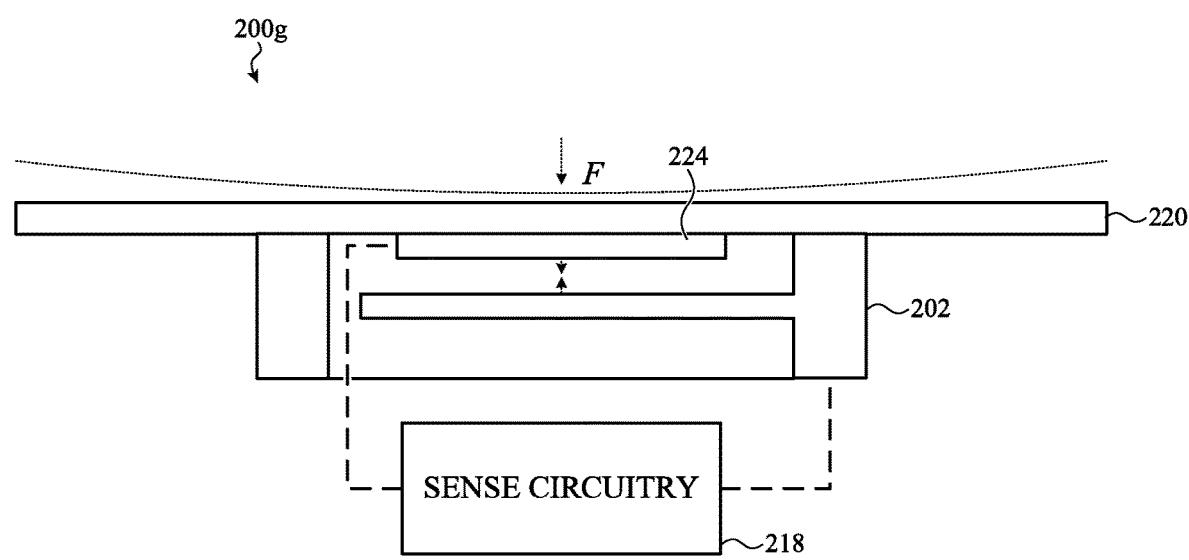
FIG. 2H depicts a cross-section of an interdigitated multimode force transducer coupled to a stiffener sheet and operating in a drive mode.

Alternatively, as shown in FIG. 2H, a simplified interdigitated multimode force transducer 200f includes a ground electrode 202 and a sense electrode 224. The simplified interdigitated multimode force transducer 200g is coupled to a stiffener 220. The body of the simplified interdigitated multimode force transducer 200g may compress in response to an external force, causing the stiffener 220 to bend in a downward direction, generating a sense signal between the sense electrode 224 and the ground electrode 202. A sense circuit 218 receives a sense signal generated between the ground electrode 202 and the sense electrode 224.

It may be appreciated that the foregoing description of FIGS. 2A-2H, and various alternatives thereof and variations thereto are presented, generally, for purposes of explanation, and to facilitate a thorough understanding of various possible configurations of an interdigitated multimode force transducer of a multimode force interface. However, it will be apparent to one skilled in the art that some of the specific details presented herein may not be required in order to practice a particular described embodiment, or an equivalent thereof.

Thus, the foregoing and following descriptions and specific embodiments are understood to be presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 3A:
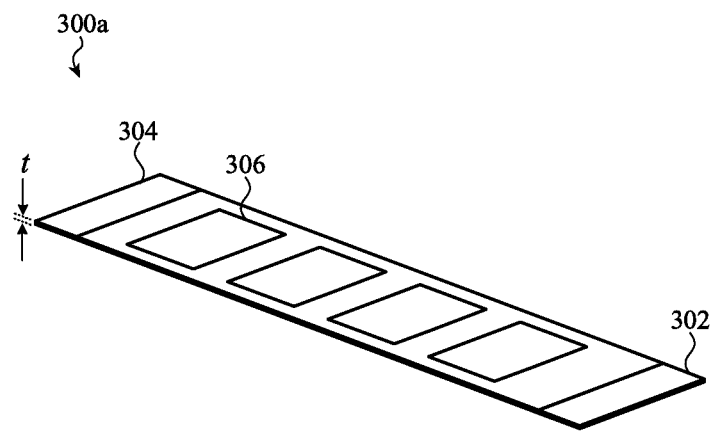
FIG. 3A depicts another example construction of an interdigitated multimode force transducer, such as described herein.

For example, the scale depicted in FIGS. 2A-2H may not be suitable in all embodiments. For example, as shown in FIG. 3A, an interdigitated multimode force transducer 300a can be substantially thinner than as depicted in FIG. 2A. In this example, the interdigitated multimode force transducer 300a includes a ground electrode 302, a drive electrode 304, and four sense electrodes aligned in a row. One sense electrode is identified as the sense electrode 306.

Figure 3B:
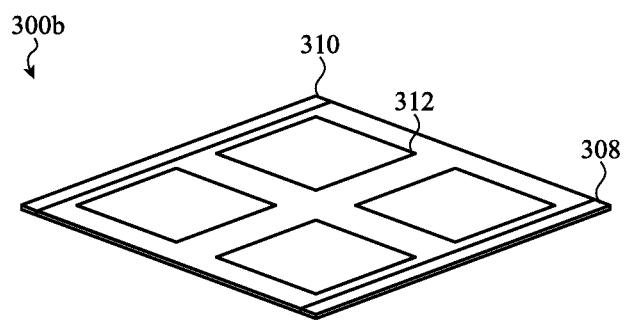
FIG. 3B depicts yet another example construction of an interdigitated multimode force transducer, such as described herein.

In further embodiments, sense electrodes can be disposed in another manner. For example, as shown in FIG. 3B, an interdigitated multimode force transducer 300b can include a ground electrode 308, a drive electrode 310, and four sense electrodes arranged as a two-by-two grid. One sense electrode is identified as the sense electrode 312.

Accordingly, it may be appreciated that an interdigitated multimode force transducer can be implemented in any suitable manner in view of the embodiments described herein. For example, in certain cases, a drive electrode and a ground electrode can include more than three planar sheets. In some examples, planar sheets of a drive electrode may be formed from a different material than planar sheets of a ground electrode. In some examples, only a single sense electrode may be required whereas in others, a large number of sense electrodes can be included.

In some embodiments, sense electrodes can be disposed onto an upper surface and a lower surface of the monolithic body of an interdigitated multimode force transducer. In another embodiment, one or more sense electrodes can be disposed within the monolithic body of an interdigitated multimode force transducer.

In still further examples, the interdigitated multimode force transducer may not necessarily include a monolithic body. For example, a drive region of the interdigitated multimode force transducer may be formed as a first monolithic region of piezoelectric material, whereas a sense region is formed as a second monolithic region of piezoelectric material. In this embodiment, the drive region and the sense region may interface one another or, in an alternative embodiment, the drive region and the sense region may be separated from one another. The drive region can be made from the same piezoelectric material as the sense region, but this may not be required. For example, in one embodiment, the drive region can be formed from potassium niobate whereas the sense region is formed from lithium niobate.

In many cases, an interdigitated multimode force transducer is coupled or laminated to a stiffener sheet. The stiffener sheet can assist in redirecting and/or transferring mechanical energy between an interface surface and the interdigitated multimode force transducer. More specifically, the stiffener sheet can be configured to redirect lateral compression or expansion of an interdigitated multimode force transducer into vertical displacement. The stiffener sheet can be made of metal, but this may not be required. For example, in other embodiments, the stiffener sheet can be made from glass, plastic, or a ceramic material.

Figure 4:
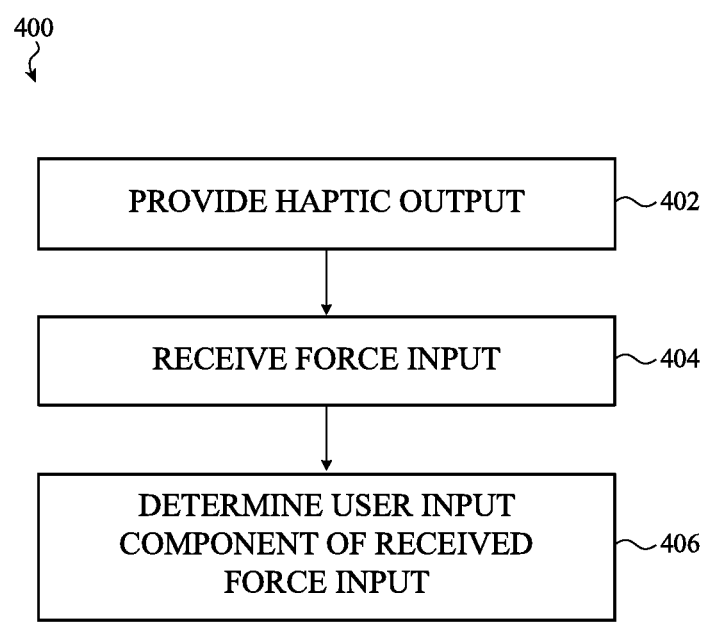
FIG. 4 is a simplified flow chart depicting example operations of a method of simultaneously operating a multimode force interface in a sense mode and a drive mode.
Figure 5:
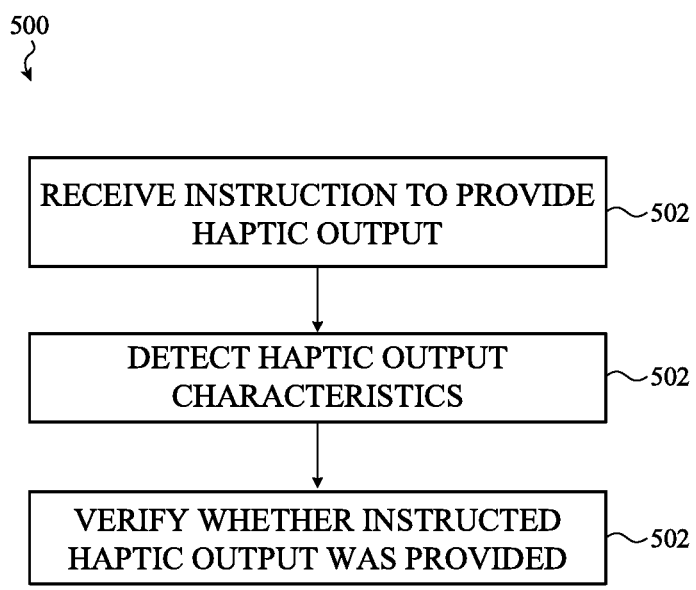
FIG. 5 is a simplified flow chart depicting example operations of a method of characterizing the performance a force transducer of a multimode force interface, such as described herein.
Figure 6:
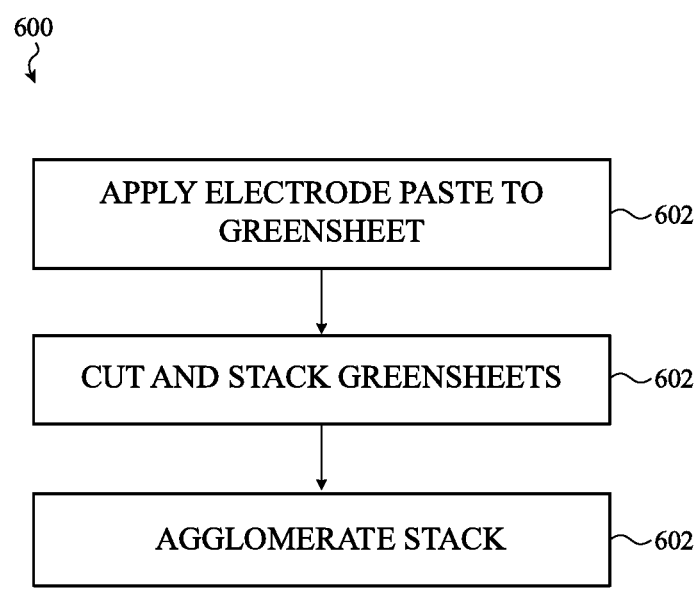
FIG. 6 is a simplified flow chart depicting example operations of a method of manufacturing a force transducer, such as described herein.

Generally and broadly, FIGS. 4-6 depict simplified flow charts that correspond to various methods that may be associated with an interdigitated multimode force transducer, such as described above.

For example, FIG. 4 is a simplified flow chart depicting example operations of a method of simultaneously operating a multimode force interface in a hybrid mode. The method 400 includes operation 402 in which haptic output is provided by a force transducer, which may be an interdigitated multimode force transducer, of a multimode force interface such as described herein. The haptic output can be generated in response to a drive signal applied to a drive electrode of one or more force transducers of the multimode force interface.

At operation 404, a force input is received. As with other embodiments described herein, the force input can be received by sense circuitry of the multimode force interface as one or more sense signals. At operation 406, the multimode force interface can filter the sense signal(s) obtained in operation 404 to remove any and/or all effects of the drive signal provided at operation 402. Filtering can include, but may not be limited to: reducing an amplitude of the sense signal, increasing an amplitude of the sense signal, low-pass filtering, high-pass filtering, band pass filtering, complex filtering, and so on. Thereafter, the filtered sense signal(s) can be correlated to a magnitude of user force input.

FIG. 5 is a simplified flow chart depicting example operations of a method of characterizing the performance a force transducer of a multimode force interface, such as described herein. The method 500 includes operation 502 in which a multimode force interface receives an instruction to provide haptic output. In response, drive circuitry can generate a drive signal and apply the drive signal to a force transducer of the multimode force interface.

While the drive signal is being applied to the force transducer, a sense signal can be read from the same transducer, or another adjacent force transducer. The sense signal can be used at operation 504 to characterize the haptic output provided at operation 502. More specifically, the sense signal can be used to determine, at operation 506, whether force transducer of the multimode force interface is functioning as instructed. In one embodiment, the sense signal can be used to detect damage to the force transducer, to the multimode force interface, or to an electronic device incorporating the multimode force interface.

FIG. 6 is a simplified flow chart depicting example operations of a method of manufacturing a force transducer, such as described herein. The method 600 includes operation 602 in which an electrode paste, which may be associated with a drive electrode, a sense electrode, or a ground electrode is applied to a ceramic green sheet of piezoelectric material using a suitable technique such as, but not limited to: vapor deposition, lamination, paste deposition, and so on. Next, at operation 602, the green sheet may be cut and stacked. Finally, at operation 604, the green sheet and electrode stack can be agglomerated and/or otherwise hardened or cured.

As noted above, many embodiments described herein reference a multimode force interface operated in conjunction with a display of a portable electronic device. It may be appreciated, however, that this is merely one example; other configurations, implementations, and constructions are contemplated in view of the various principles and methods of operation—and reasonable alternatives thereto—described in reference to the embodiments described above.

For example, without limitation, a multimode force interface can be additionally or alternatively associated with: a display surface, a housing or enclosure surface, a planar surface, a curved surface, an electrically conductive surface, an electrically insulating surface, a rigid surface, a flexible surface, a key cap surface, a trackpad surface, a display surface, and so on. The interface surface can be a front surface, a back surface, a sidewall surface, or any suitable surface of an electronic device or electronic device accessory. Typically, the interface surface of a multimode force interface is an exterior surface of the associated portable electronic device but this may not be required.

Further, although many embodiments reference a multimode force interface accommodated in a portable electronic device (such as a cell phone or tablet computer) it may be appreciated that a multimode force interface can be incorporated into any suitable electronic device, system, or accessory including but not limited to: portable electronic devices (e.g., battery-powered, wirelessly-powered devices, tethered devices, and so on); stationary electronic devices; control devices (e.g., home automation devices, industrial automation devices, aeronautical or terrestrial vehicle control devices, and so on); personal computing devices (e.g., cellular devices, tablet devices, laptop devices, desktop devices, and so on); wearable devices (e.g., implanted devices, wrist-worn devices, eyeglass devices, and so on); accessory devices (e.g., protective covers such as keyboard covers for tablet computers, stylus input devices, charging devices, and so on); and so on.

One may appreciate that although many embodiments are disclosed above, that the operations and steps presented with respect to methods and techniques described herein are meant as exemplary and accordingly are not exhaustive. One may further appreciate that alternate step order or, fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. A force transducer comprising:
a ground electrode comprising a first plurality of sheets;
a drive electrode comprising a second plurality of sheets, interdigitally aligned with the first plurality of sheets;
a monolithic body separating the first plurality of sheets from the second plurality of sheets and comprising an upper surface; and
a sense electrode array comprising at least two discrete sense electrodes disposed on the upper surface of the monolithic body.

2. The force transducer of claim 1, wherein:
the first plurality of sheets comprises an upper sheet; and
the upper sheet is below the upper surface of the monolithic body.

3. The force transducer of claim 1, wherein the monolithic body is formed from a piezoelectric material.

4. The force transducer of claim 3, wherein the piezoelectric material comprises barium titanate.

5. The force transducer of claim 1, wherein the sense electrode array is arranged in a row on the upper surface of the monolithic body.

6. The force transducer of claim 1, wherein:
the ground electrode is coupled to the sense electrode array via a sense circuit; and
the ground electrode is coupled to the drive electrode via a drive circuit.

7. The force transducer of claim 1, wherein:
the first plurality of sheets comprises a first number of sheets and the second plurality of sheets comprises a second number of sheets; and
the first number is different from the second number.

8. An electronic device comprising:
a housing;
a display within the housing;
a multimode force interface configured to provide force output and to receive force input, the multimode force interface positioned below the display and comprising:
an interdigitated force transducer comprising:
a drive electrode defined by a first set of electrically-conductive sheets extending into a monolithic body;
a ground electrode defined by a second set of electrically-conductive sheets interdigitally aligned with the first set of electrically-conductive sheets; and
an array of sense electrodes coupled to an outer surface of the monolithic body, the outer surface of the monolithic body coupled to an interior surface of the display and aligned with an active display region of the display; and
a controller coupled to the interdigitated force transducer; wherein
the controller is configured to operate the interdigitated force transducer in a drive mode to provide force output and a sense mode to receive force input.

9. The electronic device of claim 8, wherein, in the drive mode, the controller applies a drive signal to the interdigitated force transducer and, in response, the interdigitated force transducer generates a haptic output through the display.

10. The electronic device of claim 9, wherein:
the interdigitated force transducer is a first interdigitated force transducer; and
the multimode force interface comprises an array of interdigitated force transducers comprising the first interdigitated force transducer.

11. The electronic device of claim 10, wherein the array of interdigitated force transducers are arranged in a grid.

12. The electronic device of claim 8, wherein, in the sense mode, the controller receives a sense signal from the interdigitated force transducer that corresponds to a force input applied by a user to the display.

13. The electronic device of claim 8, wherein: the monolithic body comprises a piezoelectric material.

14. The electronic device of claim 8, wherein the array of sense electrodes are parallel to one of the electrically-conductive sheets of the ground electrode.

15. A method of operating a multimode force interface comprising:
providing a drive signal to a drive electrode of a force transducer, the drive electrode defined by a first set of electrically-conductive sheets extending into a monolithic body and interdigitally aligned with a second set of electrically-conductive sheets extending into the monolithic body and defining a ground electrode;
obtaining a sense signal from a sense electrode selected from an array of sense electrodes defined on an external surface of the force transducer; and
filtering the sense signal based on the drive signal.

16. The method of claim 15, wherein filtering the sense signal comprises reducing an amplitude of the sense signal.

17. The method of claim 15, wherein filtering the sense signal comprises applying a low-pass filter to the sense signal.

18. The method of claim 15, wherein the drive signal is a higher frequency signal than the sense signal.

19. The method of claim 15, wherein the drive signal is associated with a selected haptic output.

20. The method of claim 19, wherein the selected haptic output is a click.